(12) United States Patent
Shaeffer et al.

(10) Patent No.: US 10,593,379 B2
(45) Date of Patent: *Mar. 17, 2020

(54) MEMORY CONTROLLER WITH STAGGERED REQUEST SIGNAL OUTPUT

(71) Applicant: Rambus Inc., Sunnyvale, CA (US)

(72) Inventors: Ian P. Shaeffer, Los Gatos, CA (US); Bret Stott, Menlo Park, CA (US); Benedict C. Lau, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/109,607

(22) Filed: Aug. 22, 2018

(65) Prior Publication Data

US 2019/0088295 A1 Mar. 21, 2019

Related U.S. Application Data

(60) Continuation of application No. 15/626,097, filed on Jun. 17, 2017, now Pat. No. 10,062,421, which is a continuation of application No. 14/863,366, filed on Sep. 23, 2015, now Pat. No. 9,691,447, which is a continuation of application No. 14/153,822, filed on Jan. 13, 2014, now Pat. No. 9,165,617, which is a continuation of application No. 13/720,720, filed on Dec. 19, 2012, now Pat. No. 8,638,637, which is a continuation of application No. 13/336,851, filed on Dec. 23, 2011, now Pat. No. 8,339,878, which is a continuation of application No. 12/477,703, filed on Jun. 3, 2009, now Pat. No. 8,089,824, which is a continuation of application No. 11/768,107, filed on Jun. 25, 2007, now Pat. No. 7,558,150, which is a (Continued)

(51) Int. Cl.
*G11C 8/00* (2006.01)
*G11C 7/10* (2006.01)
*G06F 13/16* (2006.01)
*G06F 12/00* (2006.01)

(52) U.S. Cl.
CPC ............ *G11C 7/1063* (2013.01); *G06F 12/00* (2013.01); *G06F 13/1689* (2013.01); *G11C 7/1072* (2013.01)

(58) Field of Classification Search
CPC ..... G11C 7/1063; G11C 7/1072; G06F 12/00; G06F 13/1689
See application file for complete search history.

(56) References Cited

U.S. PATENT DOCUMENTS 5,432,823 A 7/1995 Gasbarro et al.
6,016,282 A 1/2000 Keeth
(Continued)

OTHER PUBLICATIONS

Micron Technical Note, "DDR2-533 Memory Design Guide for Two-DIMM Unbuffered Systems," TN-47-01, 2003. 19 pages.

*Primary Examiner* — Pho M Luu

(74) *Attorney, Agent, or Firm* — Lance Kreisman; Peninsula Patent Group

(57) ABSTRACT

A memory controller having a time-staggered request signal output. A first timing signal is generated while a second timing signal is generated having a first phase difference relative to the first timing signal. An address value is transmitted in response to the first timing signal and a control value is transmitted in response to the second timing signal, the address value and control value constituting portions of a first memory access request.

20 Claims, 7 Drawing Sheets

Related U.S. Application Data division of application No. 11/252,957, filed on Oct. 17, 2005, now Pat. No. 7,321,524.

(56) References Cited

U.S. PATENT DOCUMENTS

| | | |
|---|---|---|
| 6,029,250 A | 2/2000 | Keeth |
| 6,031,787 A | 2/2000 | Jeddeloh |
| 6,232,806 B1 | 5/2001 | Woeste et al. |
| 6,424,198 B1 | 7/2002 | Wolford |
| 6,449,727 B1 | 9/2002 | Toda |
| 6,600,681 B1 | 7/2003 | Korger et al. |
| 6,646,929 B1 | 11/2003 | Moss et al. |
| 6,646,953 B1 | 11/2003 | Stark |
| 6,675,272 B2 | 1/2004 | Ware et al. |
| 6,920,540 B2 | 7/2005 | Hampel et al. |
| 6,950,956 B2 | 9/2005 | Zerbe et al. |
| 6,982,922 B2 | 1/2006 | Stark |
| 6,990,042 B2 | 1/2006 | Stark |
| 7,042,914 B2 | 5/2006 | Zerbe et al. |
| 7,177,998 B2 | 2/2007 | Ware et al. |
| 7,200,055 B2 | 4/2007 | Ware et al. |
| 7,210,016 B2 | 4/2007 | Ware et al. |
| 7,225,292 B2 | 5/2007 | Ware et al. |
| 7,225,311 B2 | 5/2007 | Ware et al. |
| 7,289,383 B2 | 10/2007 | Cornelius |
| 7,321,524 B2 * | 1/2008 | Shaeffer .............. G06F 13/1689 365/233.1 |
| 7,441,138 B2 | 10/2008 | Chu et al. |
| 7,466,784 B2 | 12/2008 | Sidiropoulos |
| 7,548,601 B2 | 6/2009 | Sidiropoulos |
| 7,552,267 B2 | 6/2009 | Randell et al. |
| 7,558,150 B2 * | 7/2009 | Shaeffer .............. G06F 13/1689 365/233.11 |
| 7,734,866 B2 | 6/2010 | Tsern |
| 7,961,532 B2 | 6/2011 | Ware |
| 8,089,824 B2 * | 1/2012 | Shaeffer .............. G06F 13/1689 365/233.1 |
| 8,222,923 B1 | 7/2012 | Shimanek et al. |
| 8,339,878 B2 * | 12/2012 | Shaeffer .............. G06F 13/1689 365/194 |
| 8,411,521 B2 | 4/2013 | LaBerge |
| 8,638,637 B2 * | 1/2014 | Shaeffer .............. G06F 13/1689 365/233.1 |
| 8,793,525 B2 | 7/2014 | Zerbe et al. |
| 8,824,222 B2 | 9/2014 | Ware et al. |
| 8,984,250 B2 * | 3/2015 | Kuan .................. G06F 11/3051 365/185.33 |
| 9,001,598 B2 * | 4/2015 | Hwang ..................... G06F 1/12 365/191 |
| 9,007,853 B2 * | 4/2015 | Ware .................... G06F 13/1689 365/189.15 |
| 9,165,617 B2 * | 10/2015 | Shaeffer .............. G06F 13/1689 |
| 9,691,447 B2 * | 6/2017 | Shaeffer .............. G06F 13/1689 |
| 2005/0057292 A1 | 3/2005 | Sidiropoulos |

* cited by examiner

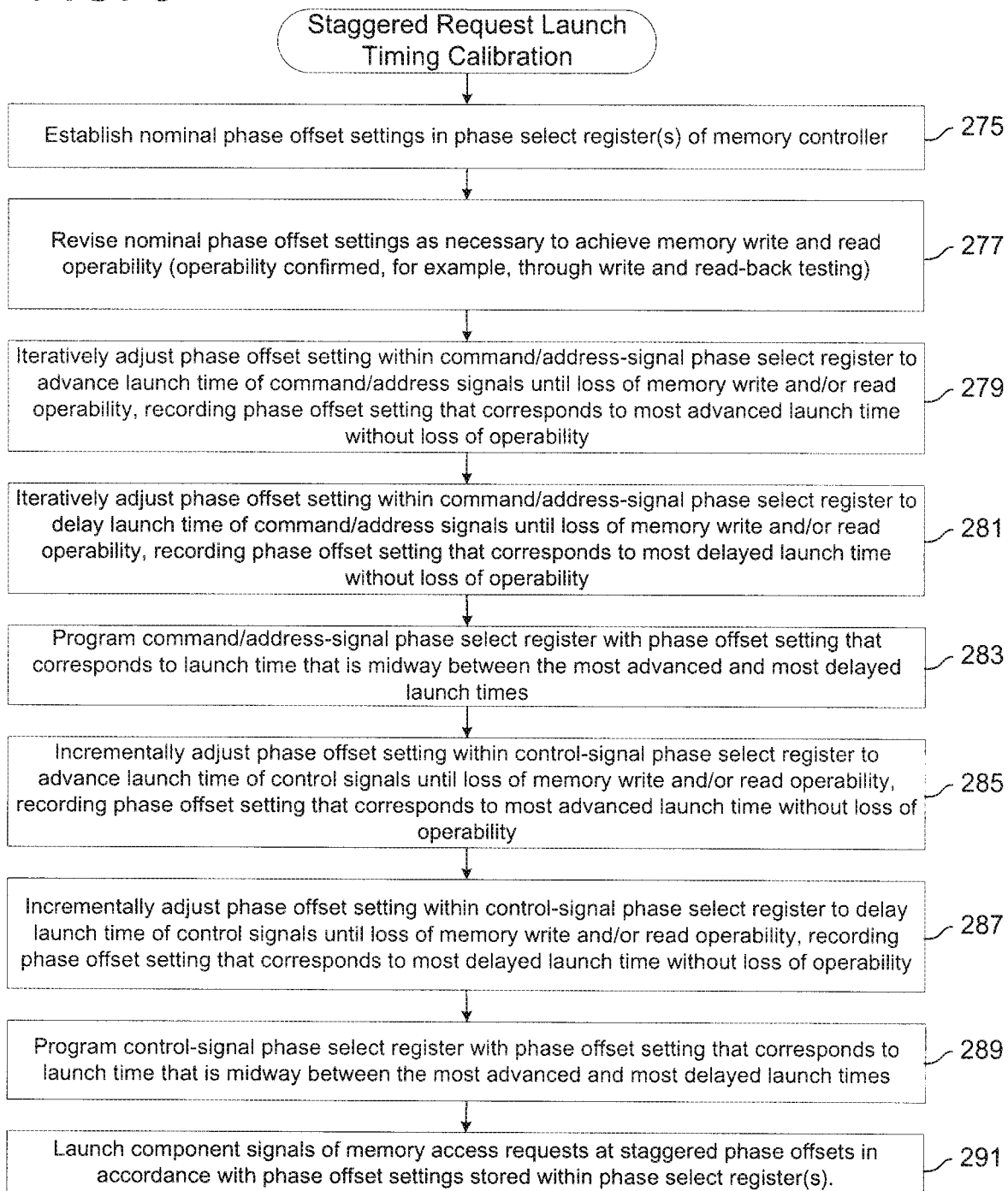

MEMORY CONTROLLER WITH STAGGERED REQUEST SIGNAL OUTPUT

RELATED APPLICATIONS

This Application is a Continuation of U.S. patent application Ser. No. 14/863,366, filed Sep. 23, 2015, is a Continuation of U.S. patent application Ser. No. 14/863,366, filed Sep. 23, 2015, issuing as U.S. Pat. No. 9,691,447, which is a Continuation of U.S. patent application Ser. No. 14/153,822, filed Jan. 13, 2014, issuing as U.S. Pat. No. 9,165,617, which is a Continuation of U.S. patent application Ser. No. 13/720,720, filed Dec. 19, 2012, issuing as U.S. Pat. No. 8,638,637 on Jan. 28, 2014, which is a Continuation of U.S. patent application Ser. No. 13/336,851, filed Dec. 23, 2011, now U.S. Pat. No. 8,339,878, issued on Dec. 25, 2012, which is a Continuation of U.S. patent application Ser. No. 12/477,703, filed Jun. 3, 2009, now U.S. Pat. No. 8,089,824, issued on Jan. 3, 2012, which is a Continuation of U.S. patent application Ser. No. 11/768,107, filed Jun. 25, 2007, now U.S. Pat. No. 7,558,150, issued on Jul. 7, 2009, which is a Divisional of U.S. patent application Ser. No. 11/252,957, filed Oct. 17, 2005, now U.S. Pat. No. 7,321,524, issued on Jan. 22, 2008, all of which are hereby incorporated by reference in their entirely.

FIELD OF THE INVENTION

The present invention relates to integrated circuits, data processing and data storage within a data processing system.

BACKGROUND

In modern memory systems, memory access requests are typically conveyed in three types of signals: command signals that indicate the nature of the access (e.g., read, write, masked write, etc.); address signals that specify memory locations to be accessed; and control signals that, in general, enable a subset of memory devices in a memory subsystem to receive the command and address signals. The memory subsystem itself is often organized as one or more ranks of memory devices (or chips), each rank consisting of memory devices that are to respond in parallel to a given memory access request, for example, by outputting read data or storing write data. In a typical arrangement, a dedicated set of control signal lines is provided for each rank of memory devices, while command and address signals are provided via one or more sets of signal lines (command/address signal lines) that are coupled in common to all the ranks in the memory subsystem. One result of this signaling arrangement is that the capacitive loading of command/address signal lines may vary depending on the number of memory ranks in the memory subsystem (which number may be expanded by addition or replacement of memory modules) and, for example, in a system having more than one memory rank, will be different from the loading of the control signal lines, resulting in skew between the relative arrival times of control signals and command/address signals. While tolerated in past systems, the skew between request signals ("request skew") consumes a progressively larger portion of the signal eye (i.e., signal valid interval) as signaling rates increase, thus shrinking timing margins and potentially limiting maximum request signaling rates.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 illustrates a run-time calibration operation that may be carried out to determine appropriate phase offsets for the various types of request signals.

DETAILED DESCRIPTION

Figure 1A:
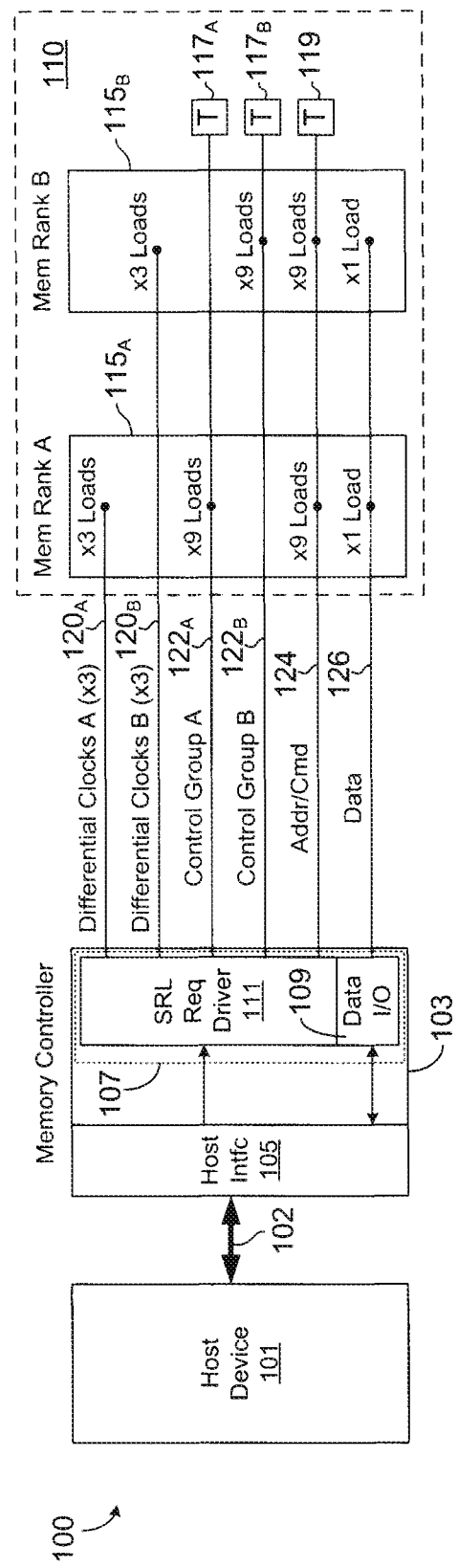
FIG. 1A illustrates an embodiment of a data processing system having programmable request signal output times.

A memory controller having circuitry to stagger the output times of component signals of a memory access request is disclosed herein in various embodiments along with embodiments of memory systems and data processing systems incorporating same. In one embodiment, timing circuitry is provided within a memory controller to provide a programmable phase offset between output times of control signals and command/address signals to mitigate signal propagation time differences that result from variations in loading of the corresponding signal lines. In a particular embodiment, a first timing circuit is provided to establish a programmable phase offset between a reference clock signal and a timing signal used to launch (i.e., enable or trigger output of) control signals, and a second timing circuit is provided to establish an interval of programmable duration, referred to herein as a programmable phase offset, between the reference clock signal and a timing signal used to launch command and address signals. By this arrangement, a phase offset between the output times of the control signals and command/address signals may be effected, for example, by establishing different programmable phase offsets for the timing signal used to launch the control signals and the timing signal used to launch the command/address signals. In an alternative embodiment, a timing circuit is provided to directly establish a phase offset between the timing signal used to launch the control signals and the timing signal used to launch the command/address signals. In either embodiment, one or more configuration registers or other configuration circuitry may be provided to store respective phase control values that are supplied to the timing circuit (or circuits) to directly or indirectly specify the phase offset between output times of the control signals and the command/address signals. In one embodiment, a programmed processor or other host device determines appropriate phase control values based on, for example, the type and amount of memory (e.g., determined by reading a serial-presence-detect (SPD) or like device that indicates the number of memory ranks and/or other information that characterizes the memory subsystem) and desired signaling rate, and then provides the phase control value(s) to the memory controller along with an instruction to store the phase control values in the configuration register (or registers) of the memory controller. The phase control values may be determined, for example, through table lookup or through calculation. In the case of table-lookup, phase control values that correspond to anticipated combinations of memory subsystem topologies (e.g., number of ranks, number of memory devices per rank, signal line loading per memory device and/or signal type, etc.) and data rates may be determined empirically or through simulation/calculation and then stored in a non-volatile storage (e.g., a non-volatile memory used to store basic input-output service (BIOS) program code and/or other boot-time program code) for access by a processor during system startup. In an alternative embodiment, appropriate phase control values may be determined at system startup and/or adjusted occasionally thereafter through one or more timing calibration operations. Such embodiments are described in further detail below.

FIG. 1A illustrates an embodiment of a data processing system 100 having programmable request signal output times. The data processing system 100 includes a host device 101 (e.g., one or more processors and associated discrete or same-die non-volatile storage to store program code), a memory controller 103 and a memory subsystem 110. The data processing system 100 may be included within a general purpose computing system (e.g., desktop, laptop or tablet computer system, server computer system, mainframe or like multi-user system, etc.), network switching apparatus (e.g., router, switch, bridge, etc.) or any number of consumer electronics devices such as gaming systems, mobile telephones, personal digital assistants (PDAs), global-positioning systems, audio/video playback systems, digital cameras, and so forth. In all such cases, the data processing system may have additional components to provide a user interface, network interface, fixed or removable storage media, and any other components necessary or useful in the target application.

In the particular embodiment shown, the memory subsystem 110 includes two memory ranks, 115$_A$ and 115$_B$, coupled to the memory controller 103 via respective sets of differential clock lines, 120$_A$ and 120$_B$, respective sets of control lines, 122$_A$ and 122$_B$, a shared set of command/address lines 124 and a shared set of data lines 126. The control signal lines 122 and command/address signal lines 124 are referred to collectively herein as request signal lines as they are used to convey memory access requests formed by address, command and control signals from the memory controller 103 to the memory subsystem 110. The clock signal lines 120 may be viewed as part of the request signal lines or as a separate timing path. The data lines 126 are provided to convey read and write data between the memory controller 103 and memory subsystem 110 and may include signal lines for conveying masking information (e.g., used to mask the writing of selected bits or groups of bits during a write operation) and error correction information, as well as timing signal lines for carrying source-synchronous timing signals such as clock signals or strobe signals, to time the sampling of data and/or mask signals conveyed on the other data signal lines.

In one embodiment, the two memory ranks 115$_A$ and 115$_B$ are disposed on a memory module (not shown) that includes termination structures 117A, 117B and 119 (e.g., resistive pull-ups to a reference voltage node) coupled to the control signal lines 122A, 122B and command/address signal lines 124, respectively. Examples of such memory modules include dual in-line memory modules (DIMMs) and single in-line memory modules (SIMMs) that are designed to be removably inserted into sockets or other mechanical interconnect structures and thereby coupled to segments of the request, data and clock signal lines formed, for example, as traces on a printed circuit board. In alternative embodiments, the memory devices that constitute each memory rank 115 may be disposed on separate memory modules and/or the termination structures 117, 119 may be disposed on a printed circuit board to which the memory modules are mounted. Also, while two memory ranks 115 are shown, more or fewer memory ranks may be provided in alternative configurations along with additional sets of control signal lines and clock signal lines. In other alternative embodiments, the host device, memory controller and/or memory devices which form one or both of the memory ranks may be disposed on a common printed circuit board (e.g., a daughterboard or motherboard), within a single integrated circuit package (e.g., in a multi-chip package or system-in-package (SIP) arrangement) or on a single integrated circuit die, in which case the request, data and clock signal lines may be formed by appropriate conductive interconnects within the package or die.

Figure 1B:
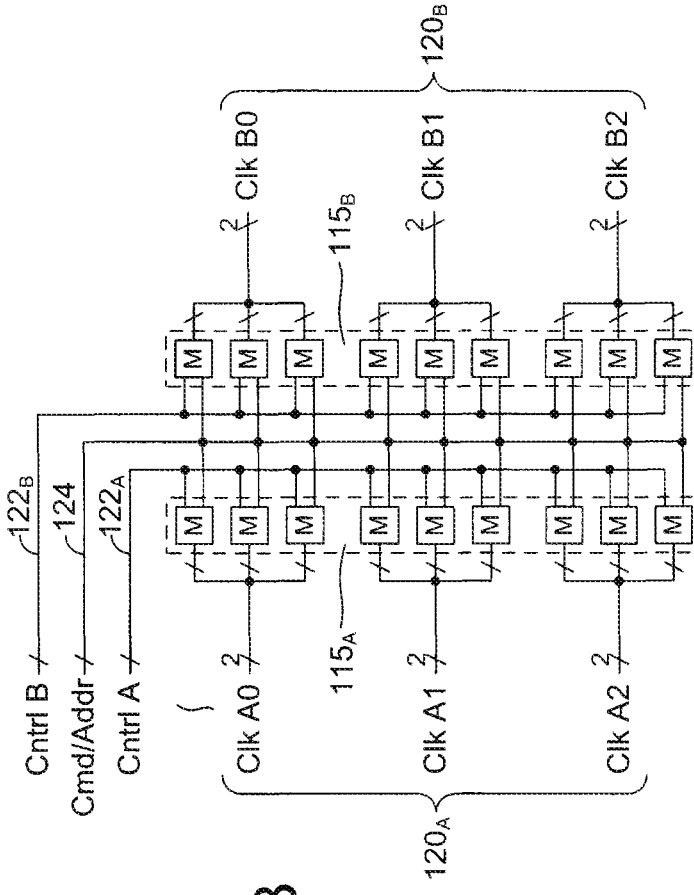
FIG. 1B illustrates an embodiment of the memory subsystem of FIG. 1A.

In one embodiment, each of the memory ranks 115 includes a respective set of nine memory devices (M) coupled to the request signal lines as shown in FIG. 1B. That is, the memory devices of memory rank 115$_A$ are coupled in common to the group-A control signal lines 122$_A$, the memory devices of rank 115$_B$ are coupled in common to the group-B control signal lines 122$_B$ and the memory devices of both ranks are coupled in common to the command/address signal lines 124. Thus, as indicated in FIG. 1A, each individual signal line of the control signal lines 122 drives nine capacitive loads and each individual signal line of the command/address signal lines 124 drives eighteen loads (i.e., nine loads per memory rank). The three pairs of clock signal lines used to convey differential clock signals to memory rank 115$_A$ (Clk A0, A1 and A2; collectively, clock lines 120$_A$) are coupled to respective groups of three memory devices, so that each clock line pair drives three capacitive loads as shown. Clock line pairs B0, B1 and B2 (collectively, clock lines 120$_B$) similarly drive three loads each in memory rank 115$_B$. More or fewer memory ranks and/or memory devices per rank may be provided in alternative embodiments, and the clock line pairs may be coupled to more or fewer memory devices (e.g., in a memory module having two ranks, each clock line pair may be coupled to two separate memory devices so that the incoming set of three clock pairs drives six capacitive loads), but in general, signaling arrangements that result in different capacitive loading of different types of request signal lines as in FIGS. 1A and 1B exhibit corresponding propagation time differences on the different types of request signal lines. In the particular example shown, for instance, the higher capacitive loading of the command/address signal lines 124 results in slower command/address signal propagation than control signal propagation.

Referring again to FIG. 1A, the memory controller 103 includes a host interface 105 and a memory interface 107. The host interface 105 is coupled via path 102 to receive memory access instructions from the host device 101 and to transfer corresponding read and write data to and from the host device 101. The memory interface 107 includes data input/output (I/O) logic 109 to manage the transfer of read and write data between the host interface 105 and the memory subsystem 110, and request logic 111 to transmit memory access requests (i.e., including constituent address/command and control values) and clock signals to the memory subsystem 110 via the request lines (122, 124) and clock lines 120, respectively. As discussed in further detail below, the request logic 109 may include circuitry to stagger the output times of signals that form or constitute a memory access request to compensate for propagation time differences on the request lines. The request logic 109 may alternatively or additionally include slew control circuitry, drive-strength control circuitry, equalization circuitry and/or other signal shaping circuitry to compensate for propagation time differences on the differently loaded request lines and/or mitigate signal distortion that might occur on all or a subset of the request signal lines due to loading variations or other variations in signal line characteristics.

Figure 2:
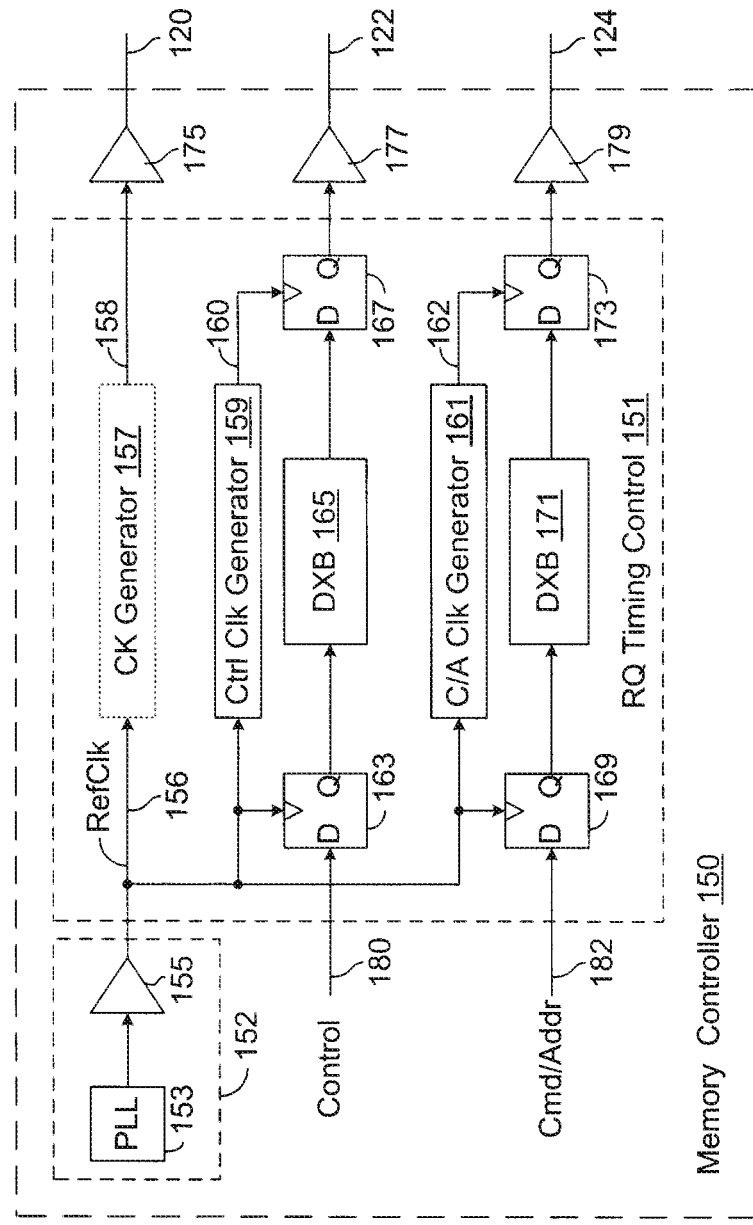
FIG. 2 illustrates an embodiment of a memory controller that may be used to implement the memory controller of FIG. 1A.

FIG. 2 illustrates an embodiment of a memory controller 150 that may be used to implement the memory controller 103 of FIG. 1A and that includes a request timing controller 151 and a clock generating circuit 152. The clock generating circuit 152, which may be implemented separately from the memory controller in an alternative embodiment (i.e., off-chip), includes a phase-locked loop 153 (PLL) and signal buffer 155 to generate a reference clock signal 156 (RefClk). A delay-locked loop (DLL) or other type of clock generating circuit may be used to implement the clock generating circuit 152 in alternative embodiments. The request timing controller 151 includes three timing circuits 157, 159, 161 that receive the reference clock signal 156 and generate respective timing signals 158, 160 and 162 that have independently controlled phase offsets relative to the reference clock signal 156 and therefore independently controlled phase offsets relative to each other. In the embodiment shown, the timing signals 158, 160, 162 are clock signals (i.e., free running periodic signals) though the timing signals may alternatively be strobe signals or other timing signals that are generated on an as-needed basis. Timing circuit 157 is referred to herein as a clock generator and is provided to generate and control the phase offset of clock signals output onto clock lines 120 by output driver 175. Timing circuits 159 and 161 are referred to herein as a control clock generator 159 and command/address clock generator 161 and are provided to generate and control the phase offset of timing signals 160 and 162, respectively; timing signals 160 and 162 themselves being referred to herein as a control clock signal and a command/address clock signal. The control clock signal 160 is supplied to the strobe input of an output buffer 167 (implemented in this example as a set of one or more flip-flops, though latches or other types of storage elements may alternatively be used) and thus determines the output buffer load time. The output buffer represents the final stage of a multi-stage buffering arrangement provided to convey control information (ultimately to be output as control signals) from the reference clock domain to the control clock domain. Thus, control information 180 that has been generated in response to a host instruction to access memory is initially buffered in a first stage buffer 163 in response to the reference clock signal 156, passes through a domain crossing buffer stage 165 (e.g., a first-in-first-out buffer or circular buffer that is loaded in response to the reference clock signal 156 and unloaded in response to the control clock signal 160 and ultimately is loaded into the final stage output buffer 167 in response to the control clock signal 160. The contents of the output buffer 167 are driven onto (i.e., transmitted on) one or more control signal lines 122 by output driver circuit 177 so that the control clock signal 160 effectively controls the time at which the control signals are output from the memory controller (i.e., the launch time). Command/address information 182 generated in response to a host memory access instruction similarly passes through a first stage buffer 169 (clocked by the reference clock signal 156) and a domain crossing buffer stage 171, before being loaded into output buffer 173 in response to the command/address clock signal 162. The contents of output buffer 173 are driven onto command/address lines 124 by output driver circuit 179 so that the command/address clock signal 162 effectively controls the launch time of the command/address clock signals.

Figure 3A:
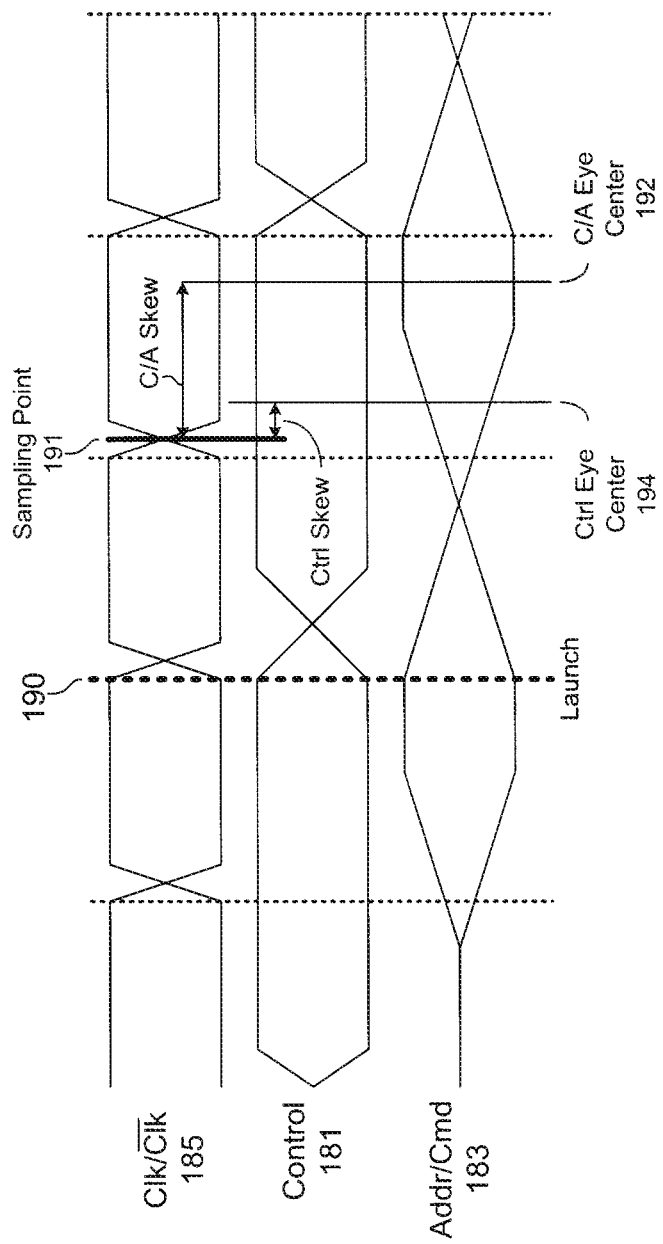
FIGS. 3A and 3B illustrate request signal skew that may result from loading differences in request signal lines, and skew mitigation that may be achieved by phase adjustment of timing signals used to launch component signals of a memory access request.
Figure 3B:
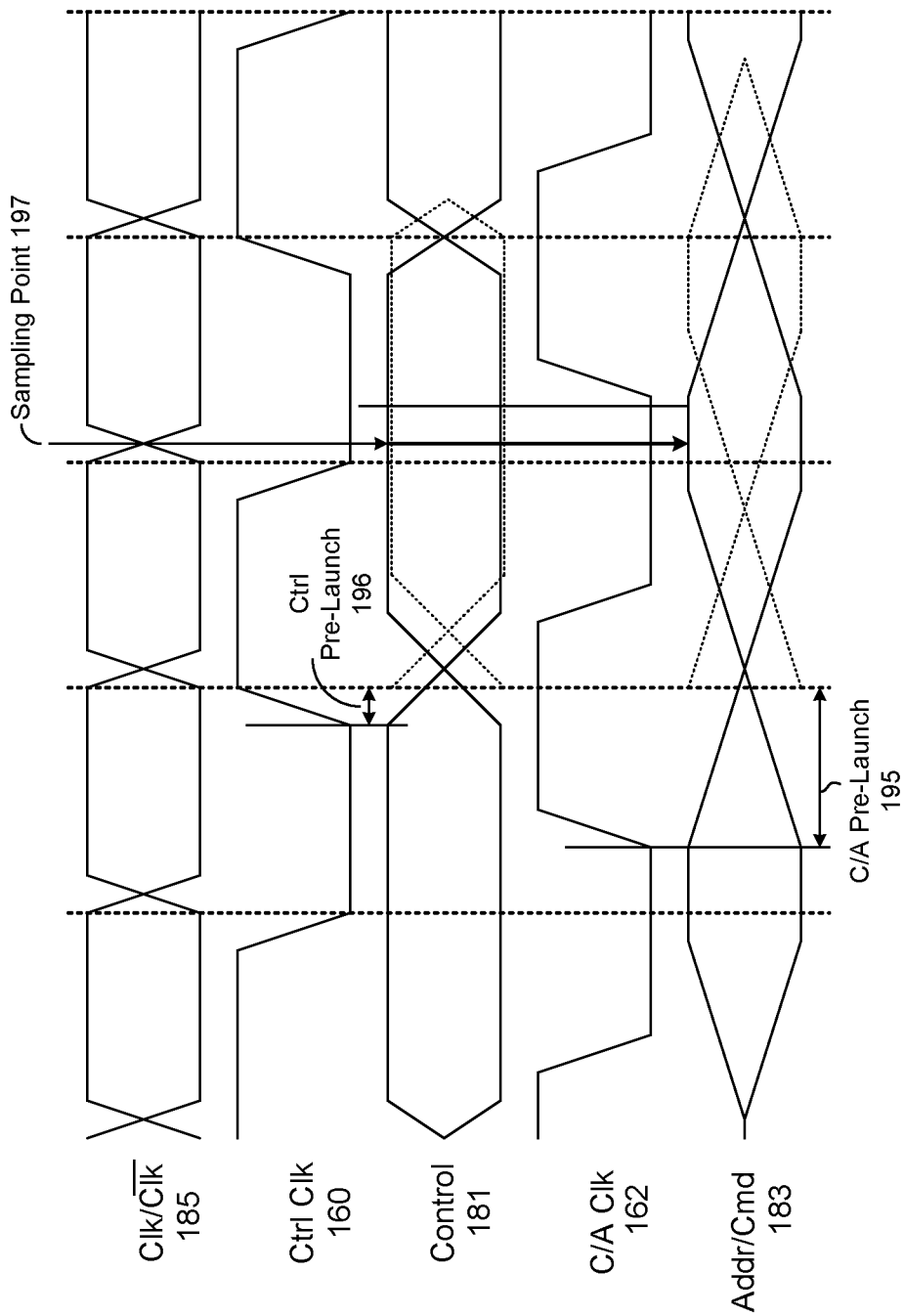

FIGS. 3A and 3B illustrate request signal skew that may result from loading differences in request signal lines, and skew mitigation that may be achieved by phase adjustment of timing signals used to launch component signals of a memory access request. Referring to FIGS. 2 and 3A, the timing signals 158, 160 and 162 generated by the request timing controller 151 are assumed to be in phase so that the control signals 181, command/address signals 183 and output clock signals 185 are all launched at the same time, as shown at 190. The heavier capacitive loading of the command/address lines 124 results in a reduced slew rate on those signal lines relative to the control lines 122 and clock signal lines 120, which in turn shifts the center 192 of the command/address signal eye (i.e., the interval over which the command/address signals 183 are valid at the recipient device) in time relative to the signal sampling point 191 indicated by the output clock crossing. This skew between the eye-center 192 or ideal sampling point of the command/address signals and the actual sampling point 191 is referred to herein as command/address skew ("C/A Skew" in FIG. 3A). Because the control lines are more heavily loaded than the clock signal lines, the eye-center 194 of the control signals 181 is also offset in time relative to the sampling point 191 (i.e., control signal skew ("Ctrl Skew")), but to a lesser degree than the command/address signals. Consequently, the control signals 181 are also skewed relative to the command/address signals 183. Note that alternative signal interconnection schemes may yield different loading of the control, clock and command/address lines relative to each other.

Referring to FIGS. 2 and 3B, the timing signals 160 and 162 have been offset in phase relative to timing signal 158 (and therefore relative to each other) to mitigate the skew that would otherwise result between the output clock signal 185, control signals 181 and command/address signals 183. More specifically, timing signal 162 has been advanced by a predetermined time interval relative to timing signal 158 to output the command/address signals 183 in advance of the output clock signals 185 (i.e., pre-launch the command/address signals), thus compensating for the longer propagation delay over the command/address signal lines 124. The time interval between transitions (or edges) of timing signals 162 and 158 is referred to herein as the command/address pre-launch interval and results in a corresponding time interval (or phase offset) between the launch times of the command/address signals 183 and output clock signal 185 as shown at 195. Timing signal 160 is similarly advanced by a separate control pre-launch interval relative to timing signal 158 to compensate for the propagation delay differences between the control signal lines and clock signal lines, and thus produces a corresponding time interval between the launch times of the control signals 181 and output clock signal 185 as shown at 196. In general, the command/address pre-launch interval and the control pre-launch interval are selected to achieve or at least promote coincident arrival of the output clock transition (i.e., the sampling edge of the output clock signal 185 indicated at 197) and eye-centers of the command/address signals 183 and control signals 181 at the component memory devices of a memory subsystem. That is, by staggering the output times of signals to be transmitted on differently loaded request signal lines, with signals being output onto slower-propagation lines earlier than associated signals output onto faster-propagation lines, it becomes possible to achieve a desired timing relationship between the request signals (and clock signals) at the destination device. In the particular example shown, for example, the clock signal transition 197 occurs at the destination device in alignment with the midpoints or centers of the command/address and control signal eyes. Other timing relationships may be enforced in alternative embodiments. For example, in an embodiment in which separate signal lines are used to convey address signals and command signals, the address signal lines may have different capacitive loading from the command signal lines. In such an embodiment, the address and command signal output times may be staggered with respect to one another to achieve coincident arrival at the component memory devices.

Figure 4:
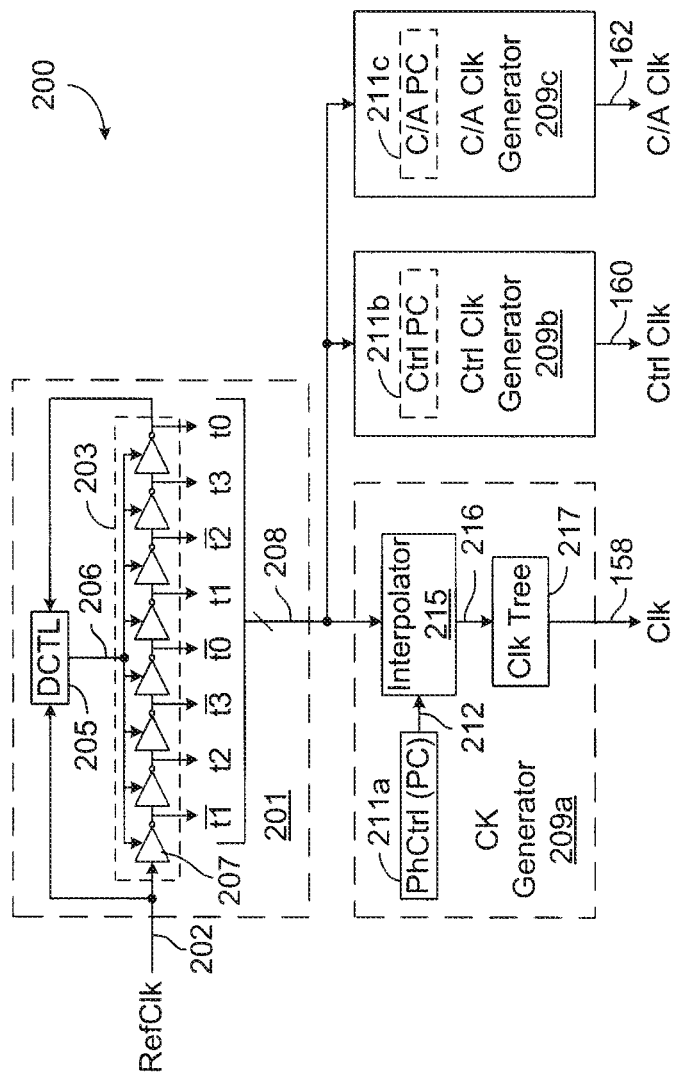
FIG. 4 illustrates timing circuitry that may be used to implement the timing circuits of FIG. 2 according to one embodiment.

FIG. 4 illustrates timing circuitry 200 that may be used to implement the three timing circuits 157, 159 and 161 of FIG. 2 according to one embodiment. The timing circuitry 200 includes a reference loop 201 and three clock generators 209a, 209b and 209c. In the embodiment shown, the reference loop 201 is a delay locked loop (DLL) having a delay line 203 formed by a series of daisy-chained delay elements 207 (biased inverters in this example) and a delay control circuit 205 (DCTL) that generates one or more bias signals 206 to control the output slew rate of, or otherwise control the delay through, each of the delay elements 207. A reference clock signal 202 is provided to an input of the delay line 203 (e.g., the first delay element in the delay-element chain) and to a first phase-detect input of the delay control circuit 205. The output of the final delay element in the delay line 203 is coupled to a second phase-detect input of the delay control circuit 205 which operates to increase and decrease the bias signal levels applied to the delay elements 207 in the delay line 203 according to whether the reference clock signal 202 leads or lags the delay line output, thus providing negative feedback to adjust the slew rate of the delay elements 207 as necessary to achieve and maintain phase alignment between the delay line output and the reference clock signal 202. By fabricating the delay elements 207 to provide substantially equal delays, the outputs of the delay elements 207 represent progressively more delayed instances of the reference clock signal 202 referred to herein as phase vectors 208 or as reference clock phases or sub-phase clock signals. In the particular example shown, the eight delay elements 207 yield eight phase vectors 208 that are offset in phase from the reference clock signal by phase angles of i*45°, where 'i' ranges from 0 to 7 and is the phase vector number and ranges from 0 to 7. The phase vectors are designated t0-t3 and /t0-/t3 in FIG. 4 to emphasize the fact that, in an ideal alignment, the phase vectors in the range 180°-315° are complements of the phase vectors in the range 0°-135°. In alternative embodiments, more or fewer than eight phase vectors 208 may be generated by increasing or decreasing the number of delay elements in the delay line 203. Also, circuits other than a DLL may be used to generate the phase vectors 208 in alternative embodiments (e.g., a phase-locked loop or any other circuit capable of generating reference clock phases).

In the embodiment of FIG. 4, the phase vectors 208 are provided to each of the clock generators 209a, 209b, 209c where they are used to generate an output clock signal 158, control clock signal 160 and command/address clock signal 162, respectively. Alternatively, instead of exporting the phase vectors 208 from the reference loop 201, the delay line 203 (or subset of inverters from the delay line) may be replicated in each of the clock generators 209a, 209b, 209c (or any subset of the clock generators 209), and the bias signals 206 developed by the delay control circuit 205 supplied to the replicated delay lines to enable local production of a phase vector set that corresponds to the phase vectors 208 generated in the reference loop. In such an embodiment, the phase vectors generated within the reference loop 201 may be supplied to load matching circuits to establish equivalent or substantially-equivalent loading between the reference-loop delay line and replicated delay lines.

In one embodiment, each of the clock generators 209 includes a phase offset register 211 (i.e., 211a, 211b and 211c, respectively), interpolator 215 and clock tree 217 coupled as shown in the detail view of clock generator 209a. The interpolator 215 receives the phase vectors 208 from the reference loop 201 (or from a replicated delay line) and a phase control value 212 from the phase offset register 211. The interpolator 215 includes circuitry to select a pair of the phase vectors 208 that bound a phase angle specified by control value 212 (e.g., the phase vectors which define a 45° octant in a 360° phase range) and circuitry to interpolate between the selected phase vectors in accordance with the specified phase angle to generate an interpolated clock signal 216 having the desired phase offset from the reference clock signal 202. The clock tree circuit 217, which may be omitted in alternative embodiments, is provided to generate multiple instances of the interpolated clock signal 216 for distribution among multiple output drivers or other circuit elements. For example, in one embodiment, multiple instances of the command/address clock signal 162 are generated and provided to multiple parallel command/address signal output circuits, thus avoiding undue loading of the interpolated clock signal 216 within the command/address clock generator 209c. Though fewer instances of the output clock signal 157 and control clock signal 160 may be required, the clock tree circuits within the clock generators 209a, 209b may be substantially similar to the clock tree circuit within the command/address clock generator 209c for load matching purposes.

Still referring to FIG. 4, it should be noted that the propagation delay through the interpolator circuit and clock tree will yield a constant, non-zero phase offset between the output clock signal and the reference clock signal (i.e., even when the phase control value specifies a zero phase offset, the non-zero phase offset will be present). In one embodiment, the constant phase offset appears the clock signals generated by each of the clock generators 209 (i.e., clock generators 209a, 209b and 209c exhibit the same or substantially the same delay through the interpolator 215 and clock tree 217) so that, while clock signals 158, 160 and 162 may exhibit an arbitrary phase offset relative to the reference clock signal 202 (i.e., due to delay in the interpolator 215 and clock tree 217), they are substantially phase aligned with each other when programmed with the same phase control setting. Circuitry to establish a known phase offset or phase alignment between reference clock signal 202 and clock signals 158, 160 and 162 (or any subset thereof) may be provided in alternative embodiments. Also, in the embodiment shown, the interpolator 215 receives a full set of phase vectors and a phase control value that provides for selection of a phase offset that ranges over a full 360° cycle of the reference clock signal. In alternative embodiments, the phase offset selection may be limited to a smaller range of phase angles within the reference clock cycle and a correspondingly reduced set of phase vectors provided.

Still referring to FIG. 4, the phase offset registers 211a, 211b, and 211c may be implemented in a number of different ways. For example, in one embodiment, each of the phase offset registers 211 is a separate register that may be addressed and programmed (i.e., have a phase control value stored therein) in response to a host instruction that specifies the register. In an alternative embodiment, each of the registers may be implemented as storage fields in a unified phase offset register. In such an embodiment, the unified phase offset register may be programmed with multiple phase control values in response to a single host instruction, or the individual fields of the register may be programmed in separate programming operations. The phase offset registers or any subset thereof may form part of a larger configuration circuit or register that is used to store additional control information pertaining to operation of the memory controller and/or memory subsystem.

Figure 5A:
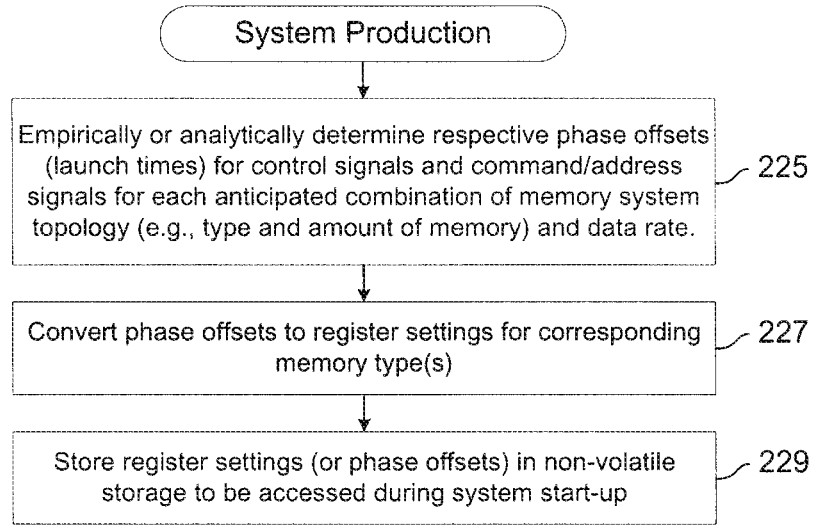
FIGS. 5A and 5B illustrate exemplary techniques for determining and establishing desired timing offsets between request signal output times.
Figure 5B:
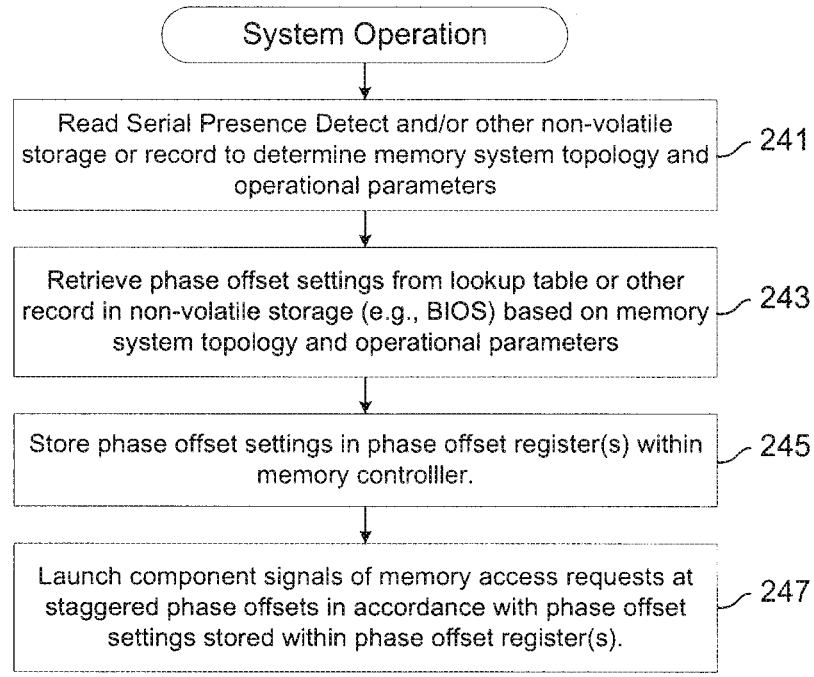

FIGS. 5A and 5B illustrate exemplary techniques for determining and establishing desired timing offsets (i.e., phase offsets) between request signal output times. More specifically, FIG. 5A illustrates a production-time approach for populating a lookup table or other data structure with settings that may be programmed into the phase offset registers 211 of FIG. 4 according to the specific memory system topology and/or other operational parameters determined at system run-time. Thus, at 225, timing offsets (i.e., phase offsets) that control the respective launch times of control signals, command/address signals and/or clock signals are determined for each anticipated combination of memory system topology and data rate. The memory system topology may be characterized, for example, by the memory controller type (e.g., indicating the available phase offset settings), type and amount of memory and/or the number of memory ranks and signal line loading per rank, or any other information that indicates the relative loading of the various types of request signal lines. The timing offsets may be determined empirically (e.g., laboratory testing and observation) or analytically (e.g., simulation, modeling or other techniques for calculating the timing offsets). However determined, at 227, the timing offsets for each anticipated topology and data-rate combination are converted to respective groups of register settings for the corresponding memory controller type. Conversion may be omitted in an embodiment in which absolute-time values are stored in registers 211. At 229, the groups of register settings are stored in respective look-up table (or other data structure) within a non-volatile storage (e.g., a BIOS storage or the like) for access during system operation.

Referring to block 241 of FIG. 5B, during system operation, the host device directly or indirectly reads a serial presence detect (SPD) electrically erasable/programmable read only memory (EEPROM) or other non-volatile storage to determine the memory system topology and/or operational parameters. For example, in one embodiment, the host processor may read an identifier from the memory controller itself or an associated storage to determine permissible programmable settings within the memory controller for controlling respective timing offsets to be applied within the request signal output circuitry. At 243, the host device retrieves phase offset settings from a lookup table or other record in a non-volatile storage (e.g., BIOS storage or the like) based on the memory system topology and operational parameters determined at 241. In an alternative embodiment in which the memory controller and memory devices are soldered or otherwise mounted to the same printed circuit board, the settings to be programmed into the memory controller may be hard-coded directly into the BIOS or other a host storage device. In either case, at 245, the host device issues register-programming instructions to the memory controller to store the phase offset settings in one or more selected phase offset registers that are used to control the relative output times of request signals. At 247, the memory controller launches component signals of a memory access request (e.g., in response to a memory access instruction from the host device) with phase offsets that are staggered relative to one another in accordance with the phase offset settings stored within the one or more phase offset registers.

In one embodiment, after the phase offset registers have been programmed, the system continues to operate indefinitely with those same register settings. Alternatively, the host device may receive feedback information relating to run-time changes in temperature and/or supply voltage and update the phase offset settings in response. Also, in an alternative embodiment, rather than tabulating phase offsets (or phase offset settings) at production time, a run-time calibration operation may be carried out to determine appropriate phase offsets for the various types of request signals. FIG. 6 illustrates an example of such a run-time calibration approach. At 275, nominal phase offset settings are recorded within the memory controller. The nominal settings may be fixed or may themselves be obtained through a lookup approach, for example, as described in reference to FIGS. 5A and 5B. At 277, the nominal phase offset settings may be revised as necessary to establish successful memory write and read operability. That is, if data write and read-back testing (i.e., a write followed by a read to the same location to confirm a match between write data and read data) fails, the phase offset settings may be iteratively revised and re-tested to establish baseline settings in which data read and write may be reliably performed.

After memory write/read operability has been established or confirmed, the phase offset setting within the command/address phase offset register is iteratively adjusted (e.g., incremented or decremented) at 279 to advance the launch time of the command/address signals until memory write/read operability is lost, recording the phase offset setting (e.g., in a temporary register) that corresponds to the most advanced launch time without loss of write/read operability. At 281, the phase offset setting within the command/address phase offset register is iteratively adjusted in the opposite direction to delay the launch time of the command/address signals until memory write/read operability is lost, again recording the phase offset setting that corresponds to the most delayed launch time without loss of write/read operability. At 283, a phase offset setting that corresponds to a launch time that is midway between the most advanced and most delayed launch times recorded in operations 279 and 281 is determined (e.g., by computing an average of the maximum and minimum launch phases) and programmed into the command/address phase select register.

At 285, the phase offset setting within the control phase offset register is iteratively adjusted (e.g., incremented or decremented) to advance the launch time of the control signals until memory write/read operability is lost, recording the phase offset setting that corresponds to the most advanced launch time without loss of write/read operability. At 287, the phase offset setting within the control phase offset register is iteratively adjusted in the opposite direction to delay the launch time of the control signals until memory write/read operability is lost, again recording the phase offset setting that corresponds to the most delayed launch time without loss of write/read operability. At 289, a phase offset setting that corresponds to a launch time that is midway between the most advanced and most delayed launch times recorded in operations 285 and 287 is determined (e.g., by computing an average of the maximum and minimum launch phases) and programmed into the control phase select register. At 291, the memory controller launches component signals of a memory access request (e.g., in response to a memory access instruction from the host device) with phase offsets that are staggered relative to one another in accordance with the phase offset settings stored within the phase offset registers.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. The term "exemplary" is used to express an example, not a preference or requirement.

While the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. A method of operation in a memory controller integrated circuit (IC) chip, the method comprising:
    during an initialization mode of operation,
        receiving information from an off-chip serial presence detect (SPD) device; and
    during a memory device access mode of operation,
        transmitting a control signal to the memory device, the control signal comprising a first component of a memory access request,
        transmitting a command/address (C/A) signal to the memory device after a delay with respect to transmitting the control signal, wherein the delay is based on the information, the C/A signal comprising a second component of the memory access request.

2. The method according to claim 1, wherein the information comprises at least one from the group comprising:
    memory system topology information and operational parameter information.

3. The method according to claim 2, wherein the information indicates relative electrical loading between a C/A signal path that routes the transmitted C/A signal, and a control signal path that routes the control signal.

4. The method according to claim 1, further comprising:
    setting the delay based on the information, wherein the information is based on a difference in propagation times for the C/A signal to travel between the memory controller and the memory device and the control signal to travel between the memory controller and the memory device.

5. The method according to claim 1, further comprising:
    setting the delay by selecting one from a plurality of transmit delays, the plurality of transmit delays based on the information, wherein the information is based on multiple combinations of memory system topology and data rate associated with the memory system topology information and data rate information.

6. The method according to claim 1, further comprising:
  delaying a timing signal by an interval corresponding to the transmit delay; and
  wherein transmitting the C/A signal comprises transmitting the C/A signal in response to the timing signal.

7. The method according to claim 1, wherein:
  the initialization mode of operation and the memory access mode of operation are carried out in accordance with a Dynamic Random Access Memory (DRAM) protocol.

8. A memory controller integrated circuit (IC) chip, comprising:
  interface circuitry to receive information from an off-chip serial presence detect (SPD) device during an initialization mode of operation;
  timing circuitry to set a transmit delay based on the information;
  request logic to generate a memory access request during a memory access mode of operation, the memory access request including a control signal and a command/address (C/A) signal;
  a first transmitter to transmit the control signal to a memory device;
  a second transmitter to transmit the C/A signal to the memory device with a delay with respect to the control signal, wherein the delay is based on the information.

9. The memory controller IC chip according to claim 8, wherein the information comprises at least one from the group comprising:
  memory system topology information and operational parameter information.

10. The memory controller IC chip according to claim 8, wherein the information indicates relative electrical loading between a C/A signal path that routes the transmitted C/A signal, and a control signal path that routes the control signal.

11. The memory controller IC chip according to claim 8, wherein:
  the timing circuitry includes circuitry to set the delay based on a difference in propagation times for the C/A signal to travel between the memory controller and the memory device and the control signal to travel between the memory controller and the memory device.

12. The memory controller IC chip according to claim 8, wherein:
  the timing circuitry includes circuitry to select one from a plurality of transmit delays, each of the plurality of transmit delays corresponding to a combination of memory system topology and data rate.

13. The memory controller IC chip according to claim 8, wherein:
  the timing circuitry includes delay circuitry to delay a timing signal by the interval corresponding to the delay, wherein the timing signal is used to launch the C/A signal.

14. The memory controller IC chip according to claim 8, further comprising:
  a third transmitter to launch a timing signal to the memory device, the timing signal to accompany the control signal and the C/A signal, and to arrive at the memory device in a predefined phase alignment with respect to the control signal and the C/A signal.

15. An integrated circuit (IC) chip comprising:
  memory control circuitry including
    interface circuitry to receive information from an off-chip serial presence detect (SPD) device during an initialization mode of operation;
    timing circuitry to set a transmit delay based on the information;
    request logic to generate a memory access request during a memory access mode of operation, the memory access request including a control signal and a command/address (C/A) signal;
    a first transmitter to transmit the control signal to a memory device;
    a second transmitter to transmit the command/address (C/A) signal to the memory device with a delay with respect to the control signal, wherein the delay is based on the information.

16. The IC chip according to claim 15, wherein the information comprises at least one from the group comprising:
  memory system topology information and operational parameter information.

17. The IC chip according to claim 15, wherein:
  the information indicates relative electrical loading between a C/A signal path that routes the transmitted C/A signal, and a control signal path that routes the control signal.

18. The IC chip according to claim 15, wherein:
  the timing circuitry includes circuitry to determine the transmit delay based on a difference in propagation times for the C/A signal to travel between the memory controller and the memory device and the control signal to travel between the memory controller and the memory device.

19. The IC chip according to claim 15, wherein:
  the timing circuitry includes circuitry to select one from a plurality of transmit delays, each of the plurality of transmit delays corresponding to a combination of memory system topology and data rate.

20. The IC chip according to claim 15, embodied as a DRAM memory controller IC chip.

* * * * *